US006562720B2

(12) United States Patent
Thilderkvist et al.

(10) Patent No.: US 6,562,720 B2
(45) Date of Patent: May 13, 2003

(54) APPARATUS AND METHOD FOR SURFACE FINISHING A SILICON FILM

(75) Inventors: Anna Lena Thilderkvist, San Jose, CA (US); Paul Comita, Menlo Park, CA (US); Lance Scudder, Santa Clara, CA (US); Norma Riley, Pleasanton, CA (US)

(73) Assignees: Applied Materials, Inc., Santa Clara, CA (US); Silicon Genesis Corporation, Campbell, CA (US)

(*) Notice: Subject to any disclaimer, the term of this patent is extended or adjusted under 35 U.S.C. 154(b) by 0 days.

(21) Appl. No.: 10/077,439

(22) Filed: Feb. 14, 2002

(65) Prior Publication Data

US 2002/0090818 A1 Jul. 11, 2002

Related U.S. Application Data

(62) Division of application No. 09/399,443, filed on Sep. 17, 1999, now Pat. No. 6,489,241.

(51) Int. Cl.[7] .............................................. H01L 21/302
(52) U.S. Cl. ....................................................... 438/695
(58) Field of Search ................................ 156/643, 646; 438/677, 695, 763

(56) References Cited

U.S. PATENT DOCUMENTS

| | | | |
|---|---|---|---|
| 3,945,864 A | | 3/1976 | Goldsmith et al. |
| 5,403,434 A | * | 4/1995 | Moslehi ..................... 134/1.2 |
| 5,968,279 A | | 10/1999 | MacLeish et al. |
| 6,008,128 A | * | 12/1999 | Habuka et al. ............. 438/695 |
| 6,107,197 A | * | 8/2000 | Suzuki ....................... 438/677 |
| 6,171,965 B1 | | 1/2001 | Kang et al. |
| 6,391,796 B1 | * | 5/2002 | Akiyama et al. ........... 438/763 |

OTHER PUBLICATIONS

Hitoshi Habuka et al. "CHange in Microroughness of a Silicon Surface during In Situ Clearing Using HF and HCl Gases", J. Electrochem Soc. vol. 145 No. 12, Dec. 1998, The Electrochemical Society Inc. pp. 4264–4272.
Michel Bruel "The History, Physics and Applications of the Smart–Cut Process", MRS Bulletin, Dec. 1998, pp. 35–43.
Jean–Pierre Colinge et al. "Silicon–on–Insulator Technology", MRS Bulletin, Dec. 1998, vol. 23, No. 12, pp. 13–23.
Steve Krause et al. "Evolution and future Trends of SIMOX Material", MRS Bulletin, Dec. 1998, pp. 25–33.
William G. En et al. "The Genesis Process: A New SOI Wafer Fabrication Method", Proceeding 1998 IEEE International SOI Conference, Oct. 1998, pp. 163–164.

* cited by examiner

Primary Examiner—David Nelms
Assistant Examiner—Dao H. Nguyen
(74) Attorney, Agent, or Firm—Blakely Sokoloff Taylor & Zafman

(57) ABSTRACT

A method of smoothing a silicon surface formed on a substrate. According to the present invention a substrate having a silicon surface is placed into a chamber and heated to a temperature of between 1000°–1300° C. While the substrate is heated to a temperature between 1000°–1300° C., the silicon surface is exposed to a gas mix comprising $H_2$ and HCl in the chamber to smooth the silicon surface.

20 Claims, 10 Drawing Sheets

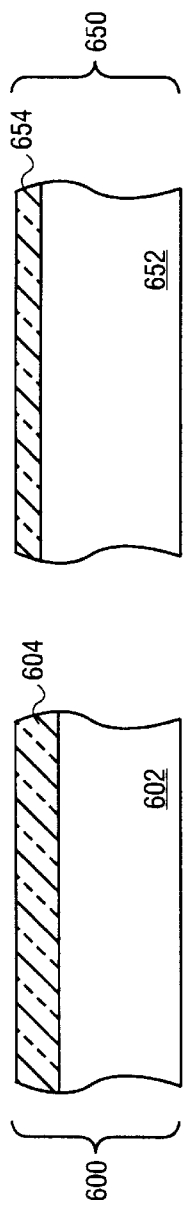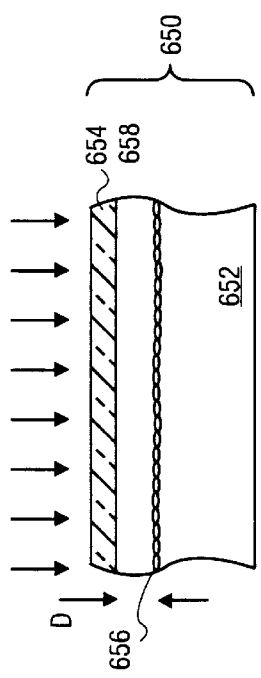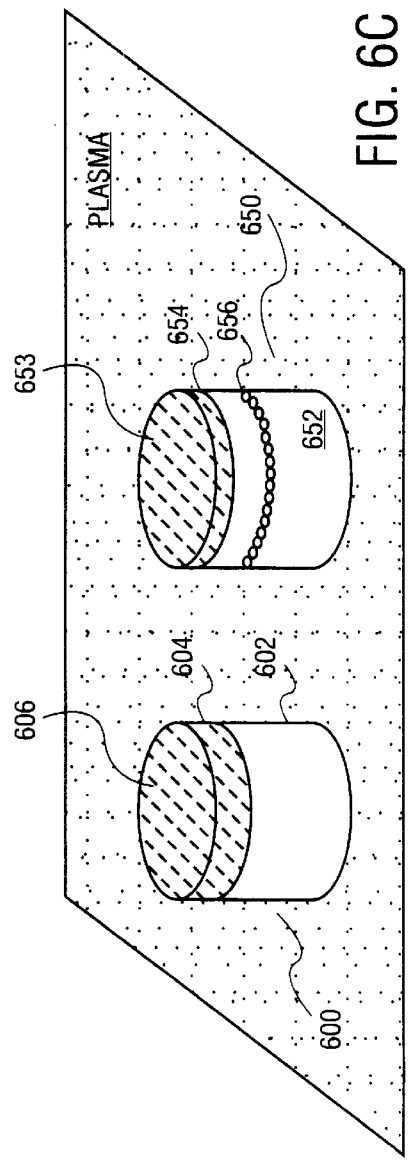

APPARATUS AND METHOD FOR SURFACE FINISHING A SILICON FILM

This is a Divisional Application of Ser. No.: 09/399,443 filed Sep. 17, 1999, now U.S. Pat. No. 6,489,241 which is presently pending.

BACKGROUND OF THE INVENTION

1. Field of the Invention

The present invention relates to the field of semiconductor processing and more specifically to a method and apparatus for smoothing a silicon or silicon alloy surface.

2. Discussion of Related Art

Semiconductor devices such as microprocessors and memories are fabricated by various steps including the deposition and removal of silicon films. Silicon deposition and removal steps as well as other process steps can cause the surface of silicon film is to become rough and contaminated. Rough and contaminated silicon surfaces can generally lead to poor quality interfaces which can lead to poor device performance and reliability. It would therefore be desirable to be able to accurately, reliably, and uniformly treat a silicon surface in order to remove any surface contaminants contained therein and to provide a smooth silicon surface finish. It would also be desirable to be able to treat a silicon surface in a chamber which could subsequently be used to deposit a silicon film. In this way after removing the surface contaminants and smoothing the silicon surface one could directly deposit a silicon film onto the uncontaminated smooth silicon surface without exposing the treated surface to an oxidizing or contaminating environment.

SUMMARY OF THE INVENTION

A method of treating a silicon surface. According to the present invention a substrate having a silicon or silicon alloy surface is placed into a chamber and heated to a temperature of between 1000° C.–1300° C. While the substrate is heated to a temperature of between 1000° C.–1300° C., the silicon surface is exposed to a hydrogen containing gas mix comprising $H_2$ and HCl in the chamber to treat the silicon surface.

BRIEF DESCRIPTION OF THE DRAWINGS

FIG. 6A is an illustration of a handle wafer and a donor wafer.

FIG. 6B is an illustration showing the ion implantation of hydrogen into the donor wafer to form a dislocation therein.

FIG. 6C is an illustration showing the plasma activation of the donor and handle wafers.

DETAILED DESCRIPTION OF THE PRESENT INVENTION

The present invention describes a method and apparatus for treating or finishing a silicon surface. In the following description numerous specific details are set forth in order to provide a thorough understanding of the present invention. One skilled in the art will appreciate that these specific details are not necessary in order to practice the present invention. In other instances, well known equipment features and processes have not been set forth in detail in order to not unnecessarily obscure the present invention.

The present invention is a method and apparatus for finishing or treating a silicon or silicon alloy surface, by smoothing the surface and removing contaminants contained therein. According to the present invention a substrate having a silicon surface is placed into a deposition chamber and heated to a temperature between 1000 C. to 1300° C. While the substrate is heated, the silicon surface is exposed to a gas mix comprising hydrogen ($H_2$) and hydrochloric acid (HCl). The relatively high temperature used during the surface treatment is sufficient to increase silicon mobility and thereby cause silicon in high areas or peaks to migrate to low areas or valleys in the film. Simultaneously with the silicon migration the gas mix removes the top of the silicon surface resulting in a smoothing of the silicon surface and removal of contaminants contained therein. The present invention is able to smooth a silicon or silicon alloy surface with a surface roughness of 6 nm RMS or more into a surface with a surface roughness of less than 0.1 nm RMS. In an embodiment of the present invention the silicon surface is treated in a silicon deposition chamber so that after the silicon surface has been sufficiently smoothened, additional silicon can be added to provide a silicon layer with any desired thickness. In an embodiment of the present invention the silicon treating process is integrated into an $H_2$ cleave process used to form a silicon on insulator (SOI) substrate.

Figure 1:
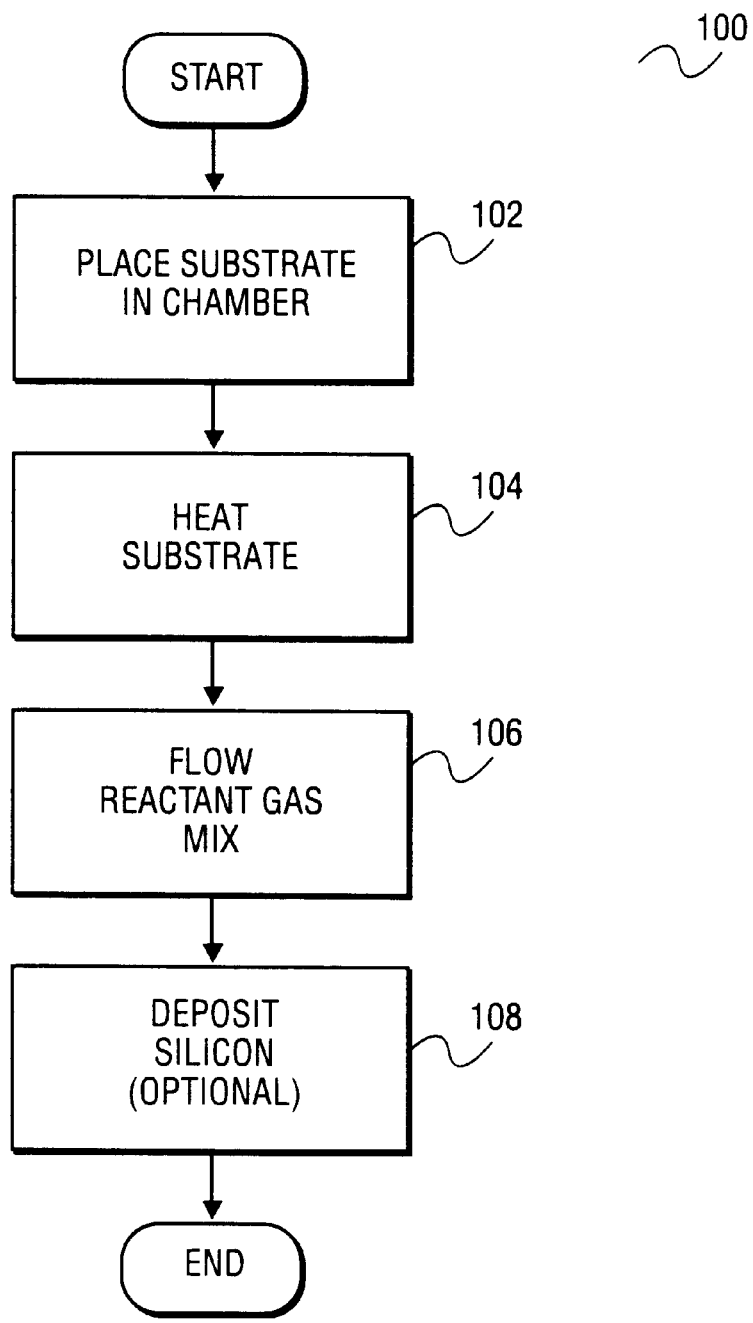
FIG. 1 is a flow chart showing a method of treating a silicon film in accordance with the present invention.
Figure 2A:
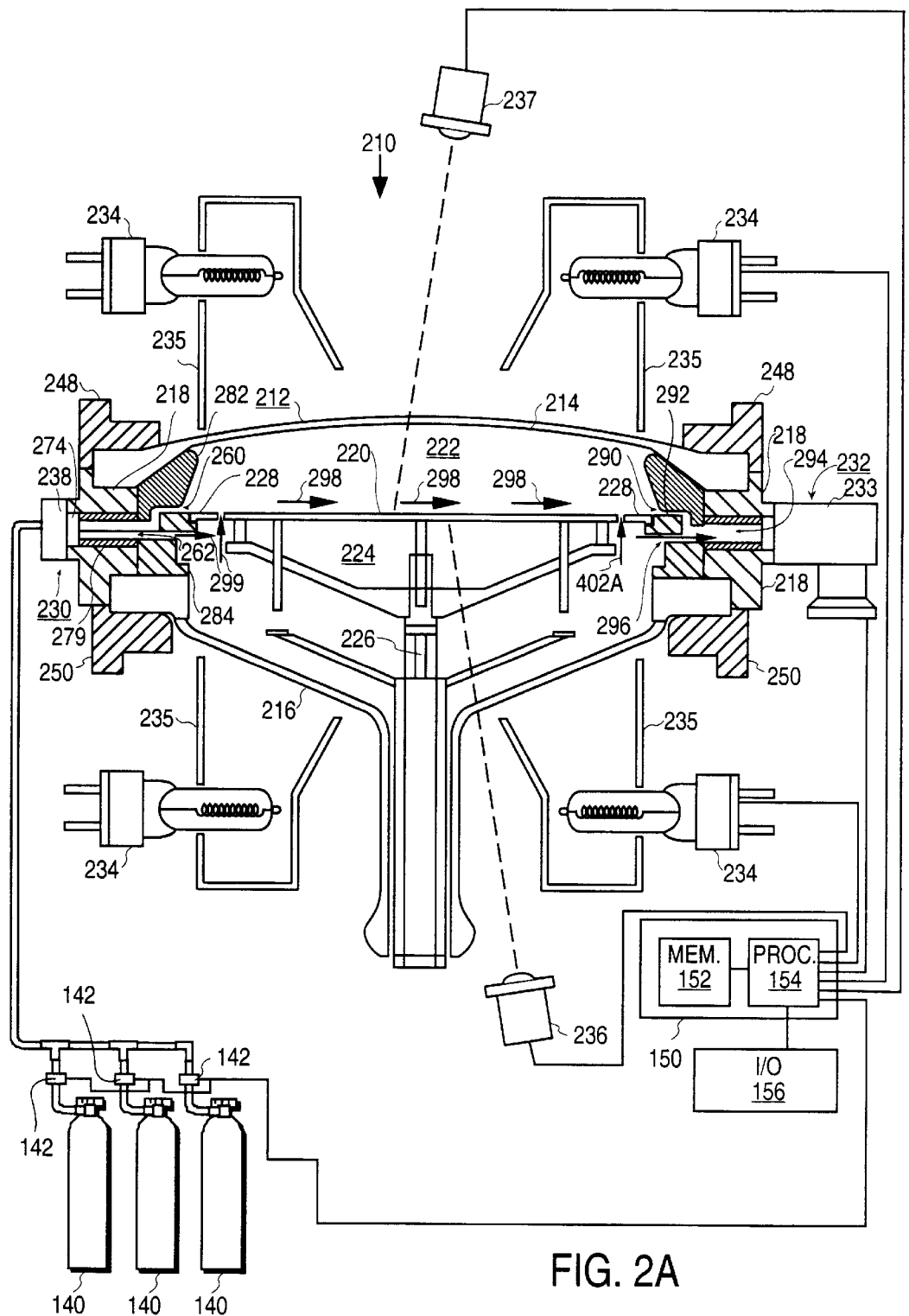
FIG. 2A is an illustration of a processing apparatus which can be utilized to treat a silicon film in accordance with the present invention.

FIG. 1 is a flow chart 100 which depicts a method of finishing or treating a silicon or silicon alloy surface in accordance with the present invention. FIG. 2A is an illustration of a thermal processing apparatus 210 in which the method of the present invention can be implemented. An example of such an apparatus is the Applied Materials single wafer atmospheric "EPI" tool known as the "EPI Centura".

Apparatus For Smoothing a Silicon or Silicon Alloy Film

The processing apparatus 210 shown in FIG. 2A, is a deposition reactor and comprises a deposition chamber 212 having an upper dome 214, a lower dome 216 and a sidewall 218 between the upper and lower domes 214 and 216. Cooling fluid (not shown) is circulated through sidewall 218 in order to cool "o" rings used to seal domes 214 and 216 against sidewall 218. An upper liner 282 and a lower liner 284 are mounted against the inside surface of sidewall 218. The upper and lower domes 214 and 216 are made of a transparent material to allow heating light to pass through into the deposition chamber 212.

Within the chamber 212 is a flat, circular susceptor 220 for supporting a wafer in a horizontal position. The susceptor 220 extends transversely across the chamber 212 at the sidewall 218 to divide the chamber 212 into an upper portion 222 above the susceptor 220 and a lower portion 224 below the susceptor 220. The susceptor 220 is mounted on a shaft 226 which extends perpendicularly downward from the center of the bottom of the susceptor 220. The shaft 226 is connected to a motor (not shown) which rotates shaft 226 and thereby rotates the susceptor 220. An annular preheat ring 228 is connected at its outer periphery to the inside periphery of lower liner 284 and extends around the susceptor 220. The pre-heat ring 228 is in the same plane as the susceptor 220 with the inner edge of the pre-heat ring 228 separated by a gap 402A from the outer edge of the susceptor 220.

An inlet manifold 230 is positioned in the side of chamber 212 and is adapted to admit gas from a source of gas or gases, such as tanks 140, into the chamber 212. An outlet port 232 is positioned in the side of chamber 212 diagonally opposite the inlet manifold and is adapted to exhaust gases from the deposition chamber 212.

A plurality of high intensity lamps 234 are mounted around the chamber 212 and direct their light through the upper and lower domes 214 and 216 onto the susceptor 220 (and preheat ring 222) to heat the susceptor 220 (and preheat ring 222). Susceptor 220 and preheat ring 222 are made of a material, such as silicon carbide, coated graphite which is opaque to the radiation emitted from lamps 234 so that they can be heated by radiation from lamps 234. The upper and lower domes 214 and 216 are made of a material which is transparent to the light from the lamps 234, such as clear quartz. The upper and lower domes 214 and 216 are generally made of quartz because quartz is transparent to light of both visible and IR frequencies; it exhibits a relatively high structural strength; and it is chemically stable in the process environment of the deposition chamber 212. Although lamps are the preferred means for heating wafers in deposition chamber 220, other methods may be used such as resistance heaters and RF inductive heaters. An infrared temperature sensor 236 such as a pyrometer is mounted below the lower dome 216 and faces the bottom surface of the susceptor 220 through the lower dome 216. The temperature sensor 236, is used to monitor the temperature of the susceptor 220 by receiving infra-red radiation emitted from the susceptor 220 when the susceptor 220 is heated. A temperature sensor 237 for measuring the temperature of a wafer may also be included if desired.

An upper clamping ring 248 extends around the periphery of the outer surface of the upper dome 214. A lower clamping ring 250 extends around the periphery of the outer surface of the lower dome 216. The upper and lower clamping rings 248 and 250 are secured together so as to clamp the upper and lower domes 214 and 216 to the side wall 218.

Reactor 210 includes a gas inlet manifold 230 for feeding process gas into chamber 212. Gas inlet manifold 230 includes a connector cap 238, a baffle 274, an insert plate 279 positioned within sidewall 218, and a passage 260 formed between upper liner 282 and lower liner 284. Passage 260 is connected to the upper portion 222 of chamber 212. Process gas from gas cap 238 passes through baffle 274, insert plate 279 and passage 260 and into the upper portion 222 of chamber 212.

Reactor 210 also includes an independent inert gas inlet 262 for feeding an inert purge gas, such as but not limited to, hydrogen ($H_2$) and nitrogen ($N_2$), into the lower portion 224 of deposition chamber 212. As shown in FIG. 2A, inert purge gas inlet 262 can be integrated into gas inlet manifold 230, if desired, as long as a physically separate and distinct passage 262 through baffle 274, insert plate 279, and lower liner 284 is provided for the inert gas, so that the inert purge gas can be controlled and directed independent of the process gas. Inert purge gas inlet 262 need not necessarily be integrated or positioned along with gas inlet manifold 230, and can for example be positioned on reactor 210 at an angle of 90° from deposition gas inlet manifold 230.

Reactor 210 also includes a gas outlet 232. The gas outlet 232 includes an exhaust passage 290 which extends from the upper chamber portion 222 to the outside diameter of sidewall 218. Exhaust passage 290 includes an upper passage 292 formed between upper liner 282 and lower liner 284 and which extends between the upper chamber portion 222 and the inner diameter of sidewall 218. Additionally, exhaust passage 290 includes an exhaust channel 294 formed within insert plate 279 positioned within sidewall 218. A vacuum source, such as a pump (not shown) for creating low or reduced pressure in chamber 212 is coupled to exhaust channel 294 on the exterior of sidewall 218 by an outlet pipe 233. Thus, process gas fed into the upper chamber portion 222 is exhausted through the upper passage 292, through exhaust channel 294 and into outlet pipe 233.

The single wafer reactor shown in FIG. 2 is a "cold wall" reactor. That is, sidewall 218 and upper and lower liners 282 and 284, respectively, are at a substantially lower temperature than preheat ring 228 and susceptor 220 (and a wafer placed thereon) during processing. For example, in a process to deposit an epitaxial silicon film on a wafer, the susceptor and wafer are heated to a temperature of between 900–1200° C. while the sidewall (and liners) are at a temperature of about 400–600° C. The sidewall and liners are at a cooler temperature because they do not receive direct irradiation from lamps 234 due to reflectors 235, and because cooling fluid is circulated through sidewall 218.

Gas outlet 232 also includes a vent 296 which extends from the lower chamber portion 224 through lower liner 284 to exhaust passage 290. Vent 296 preferably intersects the upper passage 292 of exhaust passage 290 as shown in FIG. 2A. Inert purge gas is exhausted from the lower chamber portion 224 through vent 296, through a portion of upper chamber passage 292, through exhaust channel 294, and into outlet pipe 233. Vent 296 allows for the direct exhausting of purge gas from the lower chamber portion to exhaust passage 290.

According to the present invention, process gas or gases 298 are fed into the upper chamber portion 222 from gas inlet manifold 230. A process gas, according to the present invention, is defined as a gas or gas mixture which acts to remove, treat, or deposit a film on a wafer or a substrate placed in chamber 212. According to the present invention, a process gas comprising HCl and an inert gas, such as $H_2$, is used to treat a silicon surface by removing and smoothing the silicon surface. In an embodiment of the present invention a process gas is used to deposit a silicon epitaxial layer on a silicon surface of a wafer placed on susceptor 220 after the silicon surface has been treated. Process gas 298 generally includes a silicon source, such as but not limited to, monosilane, trichlorosilane, dichlorosilane, and tetrachlorosilane, and a dopant gas source, such as but rot limited to phosphine, diborane and arsine. A carrier gas, such as $H_2$, is generally included in the deposition gas stream. For a process chamber with a volume of approximately 5 liters, a deposition process gas stream between 35–75 SLM (including carrier gas) is typically fed into the upper chamber portion 222 to deposit a layer of silicon on a wafer. The flow of process gas 298 is essentially a laminar flow from inlet passage 260, across preheat ring 228, across susceptor 220 (and wafer), across the opposite side of preheat ring 228, and out exhaust passage 290. The process gas is heated to a deposition or process temperature by preheat ring 228, susceptor 220, and the wafer being processed. In a process to deposit an epitaxial silicon layer on a wafer, the susceptor and preheat ring are heated to a temperature of between 800° C.–1200° C. A silicon epitaxial film can be formed at temperatures as low as 600° C. with silane by using a reduced deposition pressure.

Additionally, while process gas is fed into the upper chamber portion, an inert purge gas or gases 299 are fed independently into the lower chamber portion 224. An inert purge gas is defined as a gas which is substantially unreactive at process temperatures with chamber features and wafers placed in deposition chamber 212. The inert purge gas is heated by preheat ring 228 and susceptor 220 to essentially the same temperature as the process gas while in chamber 212. Inert purge gas 299 is fed into the lower chamber portion 224 at a rate which develops a positive pressure within lower chamber portion 224 with respect to the process gas pressure in the upper chamber portion 222. Process gas 298 is therefore prevented from seeping down through gap 402A and into the lower chamber portion 224, and depositing on the backside of susceptor 220.

Figure 2B:
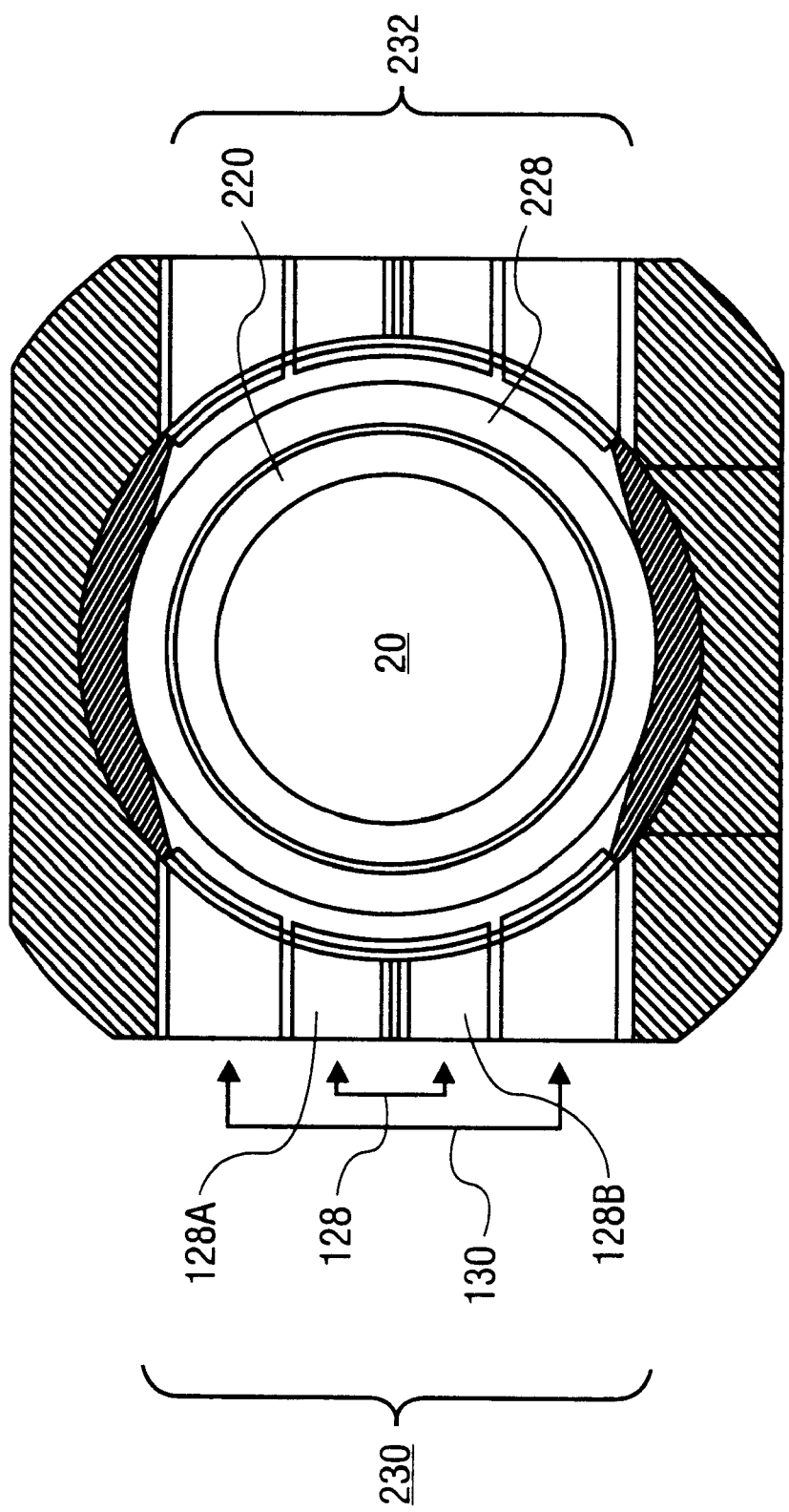
FIG. 2B is a plane view showing how a gas manifold can be divided to enable the formation of different process gas flows for different zones of the wafer.

FIG. 2B shows a portion of the gas inlet manifold 230 which supplies gas to the upper zone of the processing chamber. In FIG. 2B the insert plate 279 is shown to be constituted by an inner zone 128 and an outer zone 130. According to this embodiment of the invention the composition of the process gas which flows into inner zone 128 can be controlled independently of the composition of the gas which flows into outer zone 130. In addition, the flow rate of the gas to either of the two halves 128a–128b of the inner zone 128 can be further controlled independently from one another. This provides two degrees of control for the gas flow for the purposes of controlling the composition of the process gas mix over different zones of the semiconductor wafer.

Processing apparatus 210 shown in FIG. 2A includes a system controller 150 which controls various operations of apparatus 210 such as controlling gas flows, substrate temperature, and chamber pressure. In an embodiment of the present invention the system controller 150 includes a hard disk drive (memory 152), a floppy disk drive and a processor 154. The processor contains a single board computer (SBC), analog and digital input/output boards, interface boards and stepper motor controller board. Various parts of processing apparatus 210 conform to the Versa Modular Europeans (VME) standard which defines board, card cage, and connector dimensions and types. The VME standard also defines the bus structure having a 16-bit data bus and 24-bit address bus.

System controller 150 controls all of the activities of the apparatus 210. The system controller executes system control software, which is a computer program stored in a computer-readable medium such as a memory 152. Preferably, memory 152 is a hard disk drive, but memory 152 may also be other kinds of memory. The computer program includes sets of instructions that dictate the timing, mixture of gases, chamber pressure, chamber temperature, lamp power levels, susceptor position, and other parameters of a particular process. Of course, other computer programs such as one stored on another memory device including, for example, a floppy disk or another appropriate drive, may also be used to operate system controller 150. An input/output device 156 such as a CRT monitor and a keyboard is used to interface between a user and system controller 150.

The process for smoothing a silicon surface in accordance with the present invention can be implemented using a computer program product which is stored in memory 152 and is executed by processor 154. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program. Also stored in memory 152 are process parameters such as process gas flow rates (e.g., $H_2$ and HCl flow rates), process temperatures and process pressure necessary to carry out the smoothing of silicon films in accordance with the present invention.

Figure 2C:
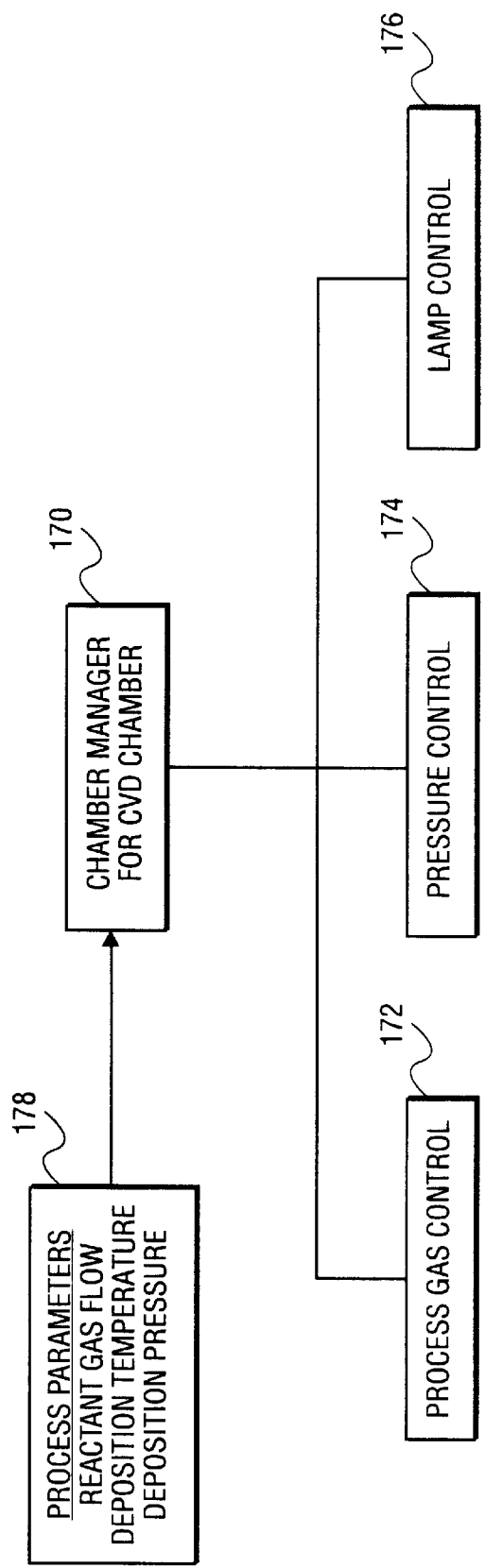
FIG. 2C is an illustration of a system control program which can be used to control the processes and apparatus of FIG. 2A.

FIG. 2C illustrates an example of the hierarchy of the system control computer program stored in memory 152. The system control program includes a chamber manager subroutine 170. The chamber manager subroutine 170 also controls execution of various chamber component subroutines which control operation of the chamber components necessary to carry out the selected process set 178. Examples of chamber component subroutines are process gas control subroutine 172, pressure control subroutine 174 and a lamp control subroutine 176. Those having ordinary skill in the art would readily recognize that other chamber control subroutines can be included depending on what processes are desired to be performed in the process chamber 212. In operation, the chamber manager subroutine 170 selectively schedules or calls the process component subroutines in accordance with the particular process set being executed. Typically, the chamber manager subroutine 170 includes steps of monitoring the various chamber components, determining which components needs to be operated based on the process parameters for the process set to be executed and causing execution of a chamber component subroutine responsive to the monitoring and determining steps.

The process gas control subroutine 172 has program code for controlling process gas composition and flow rates. The process gas control subroutine 172 controls the open/close position of the safety shut-off valves, and also ramps up/down the mass flow controllers to obtain the desired gas flow rates. The process gas control subroutine 172 is invoked by the chamber manager subroutine 170, as are all chamber component subroutines and receives from the chamber manager subroutine process parameters related to the desired gas flow rates. Typically, the process gas control subroutine 172 operates by opening the gas supply lines, and repeatedly (i) reading the necessary mass flow controllers 142, (ii) comparing the readings to the desired flow rates received from the chamber manager subroutine 170, and (iii) adjusting the flow rates of the gas supply lines as necessary. Furthermore, the process gas control subroutine 172 includes steps for monitoring the gas flow rates for unsafe rates, and activating the safety shut-off valves when an unsafe condition is detected.

The pressure control subroutine 174 comprises program code for controlling the pressure in the process chamber 212 by regulating the size of the opening of the throttle valve, thereby controlling the chamber pressure to the desired level in relation to the total process gas flow, size of the process chamber, and pumping setpoint pressure for the exhaust system. The pressure control subroutine 174 measures the pressure in the process chamber 212 by reading one or more conventional pressure manometers connected to the chamber, compares the measured value(s) to the target pressure, obtains PID (proportional, integral, and differential) values from a stored pressure table corresponding to the target pressure, and adjusts the throttle valve according to the PID values obtained from the pressure table. Alternatively, the pressure control subroutine 174 can be written to open or close the throttle valve to a particular opening size to regulate the process chamber 212 to the desired pressure.

The lamp control subroutine 176 comprises program code for controlling the power provided to lamps 234 used to heat the substrate. The lamp control subroutine 176 is also invoked by the chamber manager subroutine 170 and receives a target, or setpoint, temperature parameter. The lamp control subroutine 176 measures the temperature by measuring the voltage output of the temperature measurement devices directed at the susceptor 220, compares the measured temperature to the setpoint temperature, and increases or decreases power applied to the lamps to obtain the setpoint temperature.

Process for Treating a Silicon Film

The present invention describes a method for treating the surface of a silicon or silicon alloy film or substrate. The process of the present invention is ideally suited to treat the surface of a deposited epitaxial silicon film. The silicon surface to be treated however need not necessarily be an epitaxial silicon film and can be for example the surface of a monocrystalline silicon substrate, or can also be the surface of an epitaxial silicon alloy such as an epitaxial silicon germanium (SiGe) alloy. Additionally, the silicon film or substrate to be treated can be doped with impurities such as but not limited to arsenic, phosphorus, and boron or can be undoped if desired. Although amorphous and polycrystalline forms of silicon and silicon alloys typically have very rough surfaces which can not be smoothened to the same degree as monocrystalline films and substrates, the surface treatment of the present invention can still be used to improve the surface roughness of amorphous and polycrystalline silicon and silicon alloy films and to improve the surface quality. The present invention can be used to treat the surface of any silicon or silicon alloy film or substrate requiring some degree of surface smoothing or contamination removal.

Figure 3A:
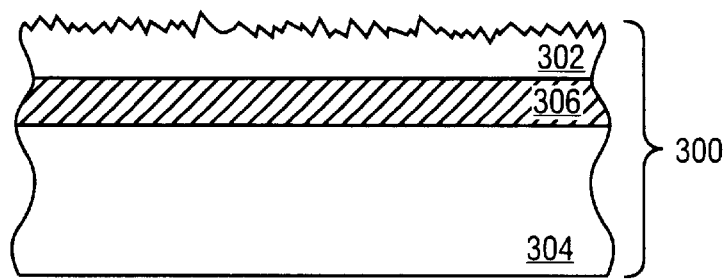
FIG. 3A is an illustration of a cross-sectional view of a substrate having an outer silicon film with a rough surface.

In the first step, as set forth in block 102 of flow chart 100 in FIG. 1, to treat a silicon or silicon alloy surface in accordance with the present invention, a substrate having a silicon or silicon alloy surface or film to be treated is placed into a thermal processing chamber such as process chamber 212 of apparatus 210 shown in FIG. 2A. According to an embodiment of the present invention, the silicon or silicon alloy film to be smoothened is an epitaxial silicon or silicon alloy having a surface roughness of at least 0.2 nm RMS and typically at least 0.8 RMS as measured by a Digital Instrument Tapping Mode AFM (Atomic Force Microscopy). RMS is the Root mean square average of the roughness of the surface. The method and apparatus of the present invention can be used to smooth an epitaxial silicon or silicon alloy having a surface roughness of greater than 6 nm RMS. In one embodiment of the present invention, the substrate to be treated is a silicon on insulator (SOI) substrate such as substrate 300 shown in FIG. 3A. Silicon on insulator (SOI) substrate 300 includes a monocrystalline silicon substrate 304. An oxide film 306 is on the monocrystalline silicon substrate 304 and an epitaxial film silicon film 302 is on the oxide film 306.

Next, as set forth in block 104, substrate 300 is heated to a temperature between 1000°–1300° C. and preferably between 1050°–1200° C. Substrate 300 is heated to a temperature which is sufficient to cause silicon atoms to migrate. In this way, silicon atoms which are located at the peaks or high spots of the rough silicon can migrate to the valleys and thereby aid in the smoothing of silicon 302. Substrate 300 can be heated to a temperature between 1000°–1300° C. by heating preheat ring 228, susceptor 220 and substrate 300 with radiation from lamps 234.

Next, as set forth in block 106 of flow chart 100, a reactant gas mix comprising HCl and an inert gas is fed into chamber 212 as substrate 300 is heated to a temperature between 1000°–1300° C. The inert gas is preferably hydrogen ($H_2$). Although hydrogen is the preferred inert gas other inert gases such as, but not limited to nitrogen ($N_2$), helium (He) and argon (Ar) can be used in place of hydrogen. Additionally, although HCl is the preferred etchant gas used for treating a silicon or silicon alloy surface other hydrogen bearing etchants such as but not limited to HBr, HI and HF may be suitable.

In an embodiment of the present invention $H_2$ and HCl are fed into the chamber 212 to generate an HCl to $H_2$ molecular concentration ratio between 1:1000 to 1:100. In a preferred embodiment of the present invention $H_2$ and HCl are fed into chamber 212 while chamber 212 is maintained at approximately atmospheric pressure, however reduced pressures may be utilized if desired. Heat from susceptor 220, preheat ring 228, and substrate 300 placed on susceptor 220 causes the thermal disassociation of $H_2$ and HCl which then react with silicon film 302 to remove the top portion thereof. Silicon film 302 can be removed at a rate between 5–80 nm/min.

Figure 4:
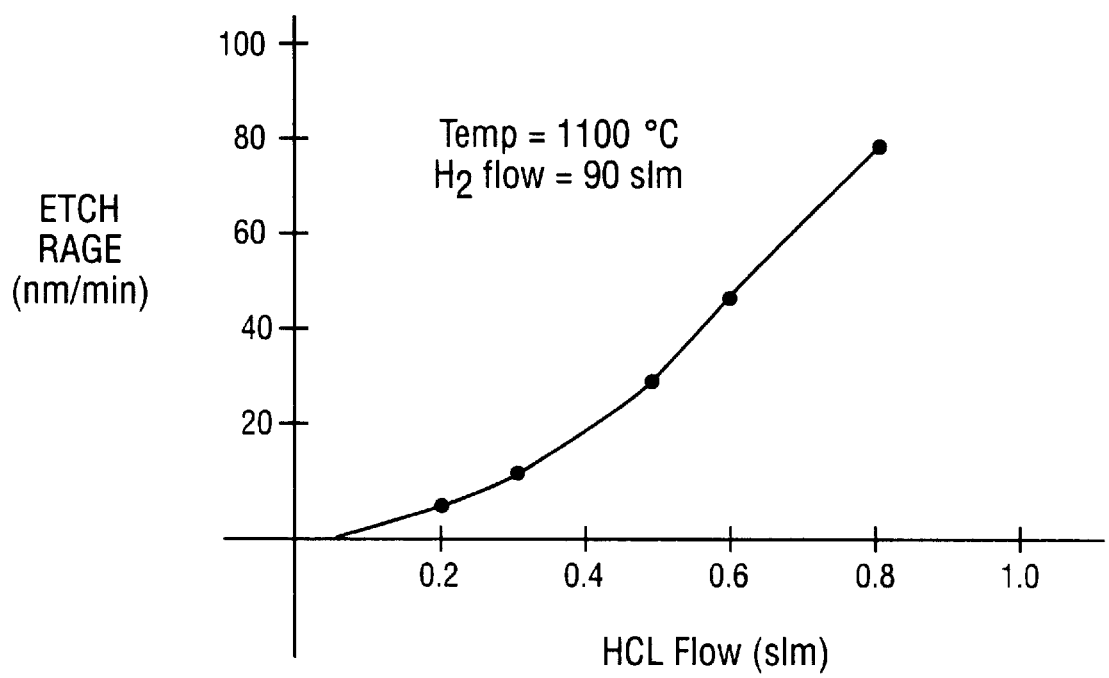
FIG. 4 is a plot which shows how silicon etch rate varies for different HCl:$H_2$ concentration ratios.

The concentration ratio and total gas flow of $H_2$ and HCl fed into process chamber 212 determines the removal rate of silicon 302. FIG. 4 illustrates the silicon etch rate (nanometers/minute) of various HCl flow rates in standard liters per minute (SLM) for a constant 90 SLM $H_2$ flow while substrate 300 is heated to a temperature of 1100° C. As is readily apparent from the graph of FIG. 4, as the HCl:$H_2$ concentration ratio increases the removal rate increases. It is to be noted that the ability of the present invention to smooth a silicon surface is dependent upon the amount of time the substrate is held at an elevated temperature. That is, since high removal rates use shorter times of etching, the smoothing is not as good. However, if one removes silicon for a long period of time, for example greater than 3 minutes, then both low and high removal rates can generate smooth silicon surfaces. Thus, high removal rates can be used to provide a smooth silicon surface as long as the substrate is exposed to reactants and to high temperatures for a sufficiently long period of time. In an embodiment of the present invention where, for example more than 100 nm of silicon film 302 is to be removed, first a high HCl:$H_2$ concentration ratio is used to provide a high removal rate to remove the bulk of the silicon film, and then a low HCl:$H_2$ concentration ratio is used to reduce the removal rate towards the end of the treatment process.

Figure 3B:
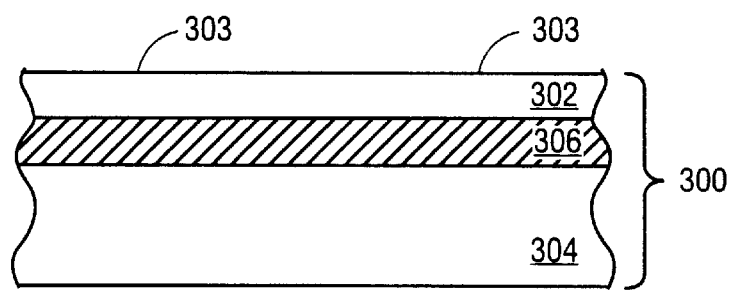
FIG. 3B is an illustration of a cross-sectional view showing a surface treatment of the silicon film on the substrate of FIG. 3A.
Figure 3C:
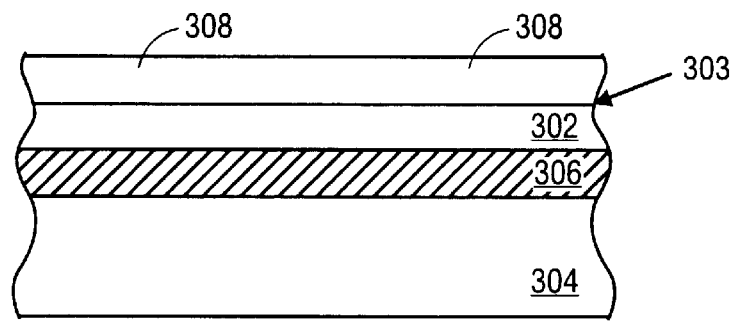
FIG. 3C is an illustration of a cross-sectional view showing the formation of a silicon film on the surface treated silicon film of FIG. 3B.

$H_2$ and HCl is continually fed into process chamber 212 until a sufficiently smooth top surface 303 of silicon film 302 is obtained. In an embodiment of the present invention $H_2$ and HCl are fed into process chamber 212 until the top surface of silicon film 302 obtains an RMS value of less than 0.5 nm and preferably less than 0.1 nm, as shown in FIG. 3B. In an embodiment of the present invention, film 302 is treated with $H_2$ and HCl at a temperature between 1000°–1300° C. until less than approximately 100 Å of silicon film 302 remains. It is to be appreciated that the outstanding uniformity of the treatment process of the present invention enables thin films of less than 100 Å to be formed across the surface of a wafer by a subtractive or removal process. Other removal processes, such as polishing, which do not have the removal uniformity of the present invention can not reliably produce such thin films across the surface of a wafer or substrate.

It has been found that in apparatus 210 the removal rate of a silicon film located at the center of process chamber 212 is different then the removal rate of the silicon film located at the outer section of process chamber 212. As such, in an embodiment of the present invention the gas flow of HCl/$H_2$ is controlled so that the outer zone 130 of the upper chamber portion 222 receives one HCl/$H_2$ gas flow while the inner zone 128 of the upper chamber portion 222 receives a second different HCl/$H_2$ gas flow. In one embodiment of the present invention the inner zone 128 of process chamber 212 receives a higher gas flow of HCl/$H_2$ than does the outer zone 130. In another embodiment of the present invention the inner zone 128 of process chamber 212 receives a lower gas flow of HCl/$H_2$ than does the outer zone 130.

Next, if desired, as set forth in block 108 of flow chart 100, a silicon film 308 is deposited onto the smooth surface 303 of silicon film 302 as shown in FIG. 3G. In one embodiment of the present invention a silicon epitaxial film is deposited over the HClH$_2$ exposed silicon film 302. Because the surface of silicon film 302 is smooth and uniform, a silicon film 308 having a smooth surface can be formed over silicon film 302. In one embodiment of the present invention, an epitaxial silicon film 308 is deposited onto silicon film 302 in the same chamber (e.g., process chamber 212) in which the surface of the silicon film was made smooth. In this way, a silicon film 308 can be formed directly onto the smooth surface of silicon film 302 without removing substrate 300 from process chamber 212 and exposing silicon film 302 to an oxidizing ambient (e.g. air) or to other potential contaminants.

The deposited silicon film 308 can be doped or undoped and preferably is epitaxial silicon. Deposited silicon film 308 however can be amorphous or polycrystalline silicon or a silicon alloy such as silicon germanium. Depositing silicon film 308 onto silicon film 302 enables the formation of a smooth silicon film having any thickness and any dopant density required. By adding an additional silicon layer after the silicon surface treatment process, more silicon can be removed during the treatment process in order to ensure a suitable surface finish without having to preserve silicon to ensure that a sufficient amount of silicon is available for the formation of devices.

In one embodiment of the present invention a silicon epitaxial film 308 is formed onto the smooth surface 303 of silicon film 302. A silicon epitaxial film 308 can be formed by heating substrate 300 to a temperature between 800–1200° C. and flowing a deposition gas comprising a silicon source gas such as but not limited to silane, dichlorosilane, trichlorosilane, etc. and $H_2$ into chamber 212. If a doped silicon film 308 is desired, an n-type dopant, such as phosphine or arsine, or a p-type dopant such as diborane can be included in the gas mix to obtain any dopant conductivity type and density as desired for silicon film 308.

Figure 5:
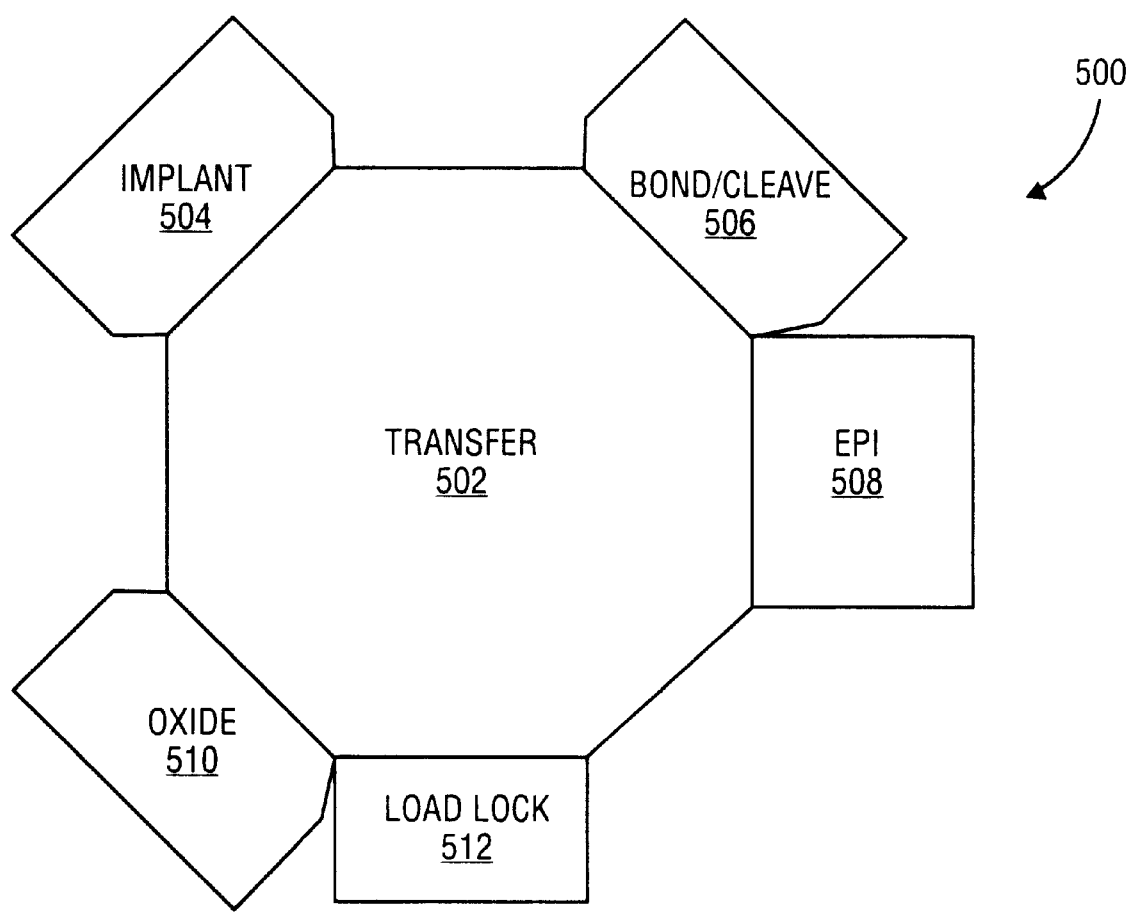
FIG. 5 is an illustration of a cluster tool which can be used to form a silicon on insulator (SOI) substrate in accordance with an implant and cleave process in accordance with the present invention.

FIGS. 6A–6I illustrate an embodiment of the present invention where the HCl treatment process of the present invention is used to provide a surface finishing of a silicon film roughened by an implant and cleave process. As illustrated in FIGS. 6A–6I, the implant and cleave process can be used to form a silicon on insulator (SOD substrate. FIG. 5 is an example of a cluster tool 500 in which the formation of a silicon on insulator substrate in accordance with the present invention can be performed. Cluster tool 500 includes a transfer chamber 502 to which are attached a plurality of different process apparatuses including, an implant chamber 504, a bond/cleave chamber 506, a surface Treatment/Epi chamber 508, such as apparatus 210 shown in FIG. 2A, an oxide formation apparatus 510 and a loadlock 512. Other chambers, such as a cool down chamber or chambers and/or additional loadlocks, can be attached to transfer chamber 502 as required.

Implant chamber 504 is used to implant ions into a donor wafer to form dislocations in the donor substrate to enable the subsequent cleave of the silicon film. Bond/cleave apparatus 506 is used to bond the handle wafer to the implanted donor wafer and is used to cleave the donor wafer from the handle wafer at the implant dislocation. The Treatment/Epi chamber 508 is used to treat or smooth the surface of the silicon film after the cleave process and can be used to deposit an epitaxial silicon film on the treated silicon surface. The Treatment/Epi apparatus can also be used to smooth the silicon surface of the donor wafer and to deposit additional silicon thereon if desired. Loadlock 512 is used to transfer wafers or substrates into a transfer chamber 502 of cluster tool 500. Transfer chamber 502 is attached to an exhaust system such as a pump and a source of inert gas, such as nitrogen ($N_2$) so that wafers can be transferred between the various process apparatuses in cluster tool 500 in a reduced pressure ambient or in an inert ambient so that wafers are not exposed to an oxidizing ambient or to sources of contamination. Oxide formation apparatus 510 is used to form an oxide on the donor wafer (or handle wafer if desired). Oxide formation apparatus can be for example, a thermal oxidation apparatus such as a furnace or a rapid thermal processor in which a thermal oxide can be grown on a silicon film. Alternatively, oxide formation apparatus 510 can be a chemical vapor deposition (CVD) apparatus.

In order to form a silicon on insulator (SOI) substrate in accordance with an embodiment of the present invention, a handle wafer 600 and a donor wafer 650 as shown in FIG. 6A are provided. The donor wafer 650 is the wafer (or substrate) which provides a layer or layers to be transferred. The handle wafer 600 is the wafer which receives the transferred layers from the donor wafer and is the wafer which will eventually become the silicon on insulator (SOI)

substrate. Handle wafer 600 includes a monocrystalline silicon substrate 602. Silicon substrate 602 can be doped to any conductivity type (n-type or p-type) and to any conductivity level desired. In one embodiment of the present invention silicon substrate 600 is a p-type substrate having a doping density of between $10^{15}$–$10^{19}$ atoms/cm$^3$. Handle wafer 600 can also include an oxide film 604 formed thereon. In an embodiment of the present invention Oxide film 604 is between 100–400 nm thick. Oxide film 604 can be thermally grown by exposing silicon substrate 602 to an oxidizing ambient, such as oxygen, at a temperature between 800–1250° C. in apparatus 510.

Donor wafer 650 includes a monocrystalline silicon substrate 652 with an oxide film 654 formed thereon. Silicon substrate 652 can be doped to any desired conductivity type and level desired. In an embodiment of the present invention silicon substrate 652 can be doped to a level between $10$–$10^{19}$ atoms/cm$^3$. Oxide film 654 can be formed by thermal layer oxidizing silicon substrate 652 in an oxidizing ambient in apparatus 510 as described above. Oxide film 654 typically has a thickness between 100–400 nm. Alternatively, to growing an oxide on both donor wafer 650 and handle wafer 600 one can grow an oxide on only donor wafer 650 or on only handle wafer 600 if desired.

Next, as shown in FIG. 6B, donor wafer 650 is moved into implant chamber 504 and is implanted with ions to form dislocation 656. Donor wafer 650 can be implanted with hydrogen atoms or with inert ions such argon (Ar) or helium (He). In one embodiment of the present invention donor wafer 650 is ion implanted with a plasma immersion ion implantation process. Such a process can implant high doses of hydrogen (H$_2$) into substrate 652. In such a process a high voltage negative bias is applied to donor wafer 650 to accelerate the ions towards the wafer face (oxide layer 654). The plasma immersion ion implantation process implants the entire donor wafer surface. The P-III Ion Implantation System developed by Silicon Genesis can be used for a plasma immersion ion implantation step. Additionally, ion implantation can be carried out using, for example, beam line ion implantation equipment manufactured by companies such as Applied Materials, Eaton Corp., Varian and others. In this embodiment, implantation of hydrogen generates an internal hydrogen rich layer within the donor wafer 650, thereby forming dislocation 656. The depth, D, of the ion implantation peak determines the thickness of donor silicon layer 658 which will subsequently be removed from silicon substrate 652 of donor wafer 650. In an embodiment of the present inventions ions are implanted between 100–500 nm into substrate 652 of donor wafer 650.

Figure 6D:
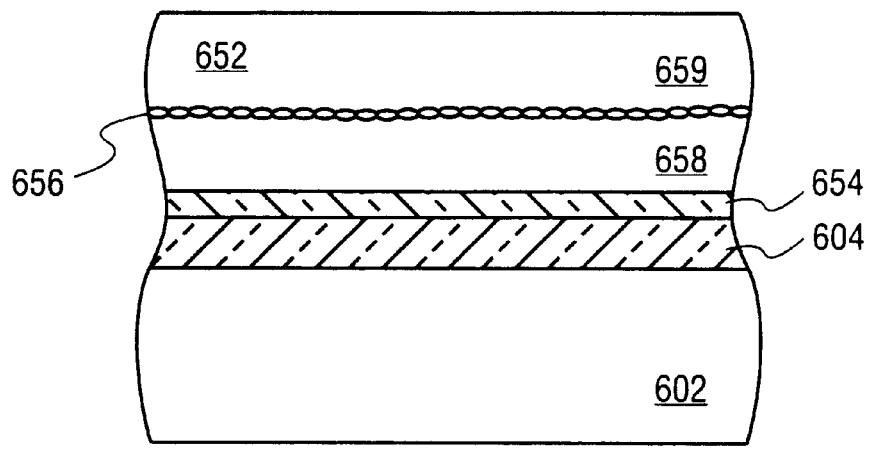
FIG. 6D is an illustration showing the bonding of the donor wafer to the handle wafer.

Next, the ion implanted donor wafer 650 and the handle wafer 600 are placed into bond/cleave apparatus 506. In bond/cleave apparatus 506 donor wafer 650 is bonded to handle wafer 600 as shown in FIG. 6D. In one embodiment of the present invention oxide 654 of donor wafer 650 is bonded to oxide 604 of handle wafer 600. In an embodiment of the present invention the handle and donor wafers are bonded using a low temperature plasma activated bond process. By using plasma activation of the bond interface, higher bond strength can be achieved at low process temperatures (e.g. room temperature). In accordance with an embodiment of the present invention both the handle wafer and the donor wafer are exposed to a low temperature plasma as shown in FIG. 6C in order to generate plasma activated bonding interfaces 606 and 653 respectively. It is to be appreciated that other suitable bonding techniques may be used to bond the handle wafer to the donor wafer.

Next, the donor wafer 650 is flipped upside-down so that bond interface 653 can be attached to the bond interface 606 of handle wafer 600 as shown in FIG. 6D. The donor and handle wafer stack is then compressed together to securely bond interface 653 to interface 606. Plasma activation of the bond interfaces helps achieve a sufficiently strong bonding for a subsequent room temperature cleave process.

Figure 6E:
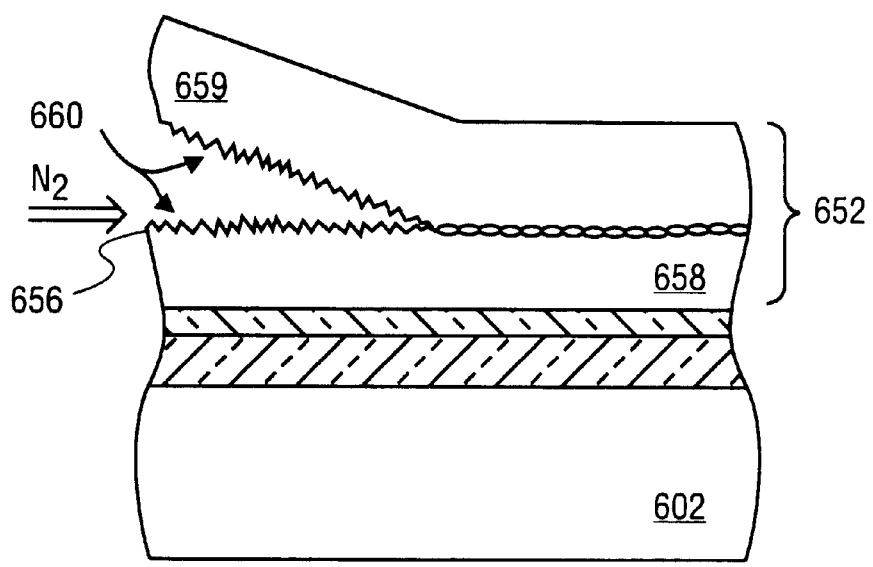
FIG. 6E is an illustration showing the cleaving of a portion of the donor wafer from the handle wafer.

Next, as shown in FIG. 6E, the lower portion 659 of silicon substrate 652 is separated or cleaved from silicon substrate 652 at dislocation 656 of donor wafer 650, leaving donor silicon layer 658 attached to handle wafer 600. In an embodiment of the present invention a Room Temperature Controlled Cleaved Process (RT/CCP) is used to separate the bonded pair at the implant dislocation 656 without using heat. The RT/CCP process initiates a separation at one point on the wafer and propagates that separation across the entire wafer through mechanical means. In one embodiment of the present invention as shown in FIG. 6E a nitrogen stream is focused at the edge of the dislocation to cause separation.

The implant, bond, and cleave process transfers oxide film 654 and donor silicon layer 658 to handle wafer 600. The transfer generates a silicon on insulator (SCI) substrate wafer comprising a silicon wafer 602 with an oxide layer 654/604 buried under a thin donor silicon layer 658 of monocrystalline silicon. The thickness of the top donor silicon layer 658 is determined by the depth of the hydrogen implant.

Figure 6F:
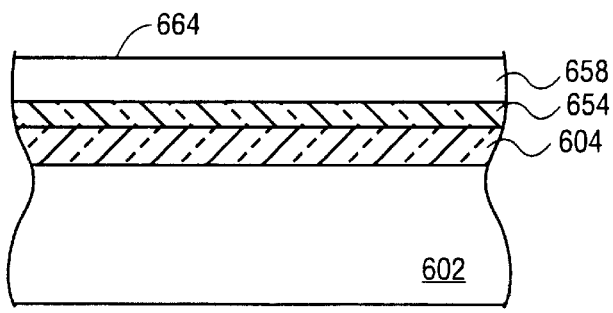
FIG. 6F is an illustration showing the treatment of the top surface of the silicon film formed on the handle water.

As shown in FIG. 6E, the implant and cleave process forms a very rough silicon surface 660, where donor silicon layer 658 is separated from silicon substrate 652. The implant and cleave process will typically form a silicon surface having a surface roughness of between 2–8 nm RMS. In order to provide a suitable surface finish, handle wafer 600 along with oxide 654 and donor silicon layer 658 is transferred into Treatment/Epi chamber 508 and processed as defined in flow chart 100 of FIG. 1 in order to surface treat the rough silicon surface 660 of donor silicon layer 658 into a suitably smooth surface 664 as shown in FIG. 6F. Donor silicon layer 658 can be suitably treated by heating handle wafer 600 to a temperature between 1000 C.–1300° C. and preferably between 1050° C.–1200° C. and then exposing donor silicon layer 658 to a gas mix comprising H$_2$ and HCl. In an embodiment of the present invention handle wafer 600 is exposed to a gas mix comprising an HCl:H$_2$ molecular concentration ratio between 1:100 to 1:1000. Handle wafer 600 is heated and exposed to H$_2$ and HCl until a suitably smooth surface finish 664 of a surface roughness less than 0.5 nm RMS and preferably less than 0.1 nm RMS is obtained. In an embodiment of the present invention between 50–100 nm of donor silicon layer 658 is removed in order to generate a sufficiently smooth surface. In one embodiment of the present invention after donor silicon layer 658 has been sufficiently treated, between 90–300 nm of donor silicon layer 658 remains. In another embodiment of the present invention, the top donor silicon layer 658 is treated to thin the donor silicon layer 658 to less than 200 Å and preferably between 50–100 Å. Such a thin donor silicon layer 658 can be used to produce a compliant substrate for depositing a relaxed defect free epitaxial silicon germanium film.

Additionally, as described above, the HCl:H$_2$ concentration ratio can be varied during smoothing in order to increase or decrease the removal rate and the HCl:H$_2$ flow can be varied across the surface of the wafer (inner and outer locations) in order to manipulate the removal rate across the surface of the wafer.

Not only does the smoothing process of the present invention smooth the surface of donor silicon layer 658 but it also repairs damage and removes contamination caused by the implant/cleave process. For example, the surface treatment process removes hydrogen rich silicon from the surface of donor silicon layer 658. Additionally, the high temperature process used to treat the silicon film repairs dangling silicon bonds created by the implant and cleave process. Thus, the high temperature treatment process of the present invention alleviates the need for a subsequent high temperature anneal typically used after cleaving.

Figure 6G:
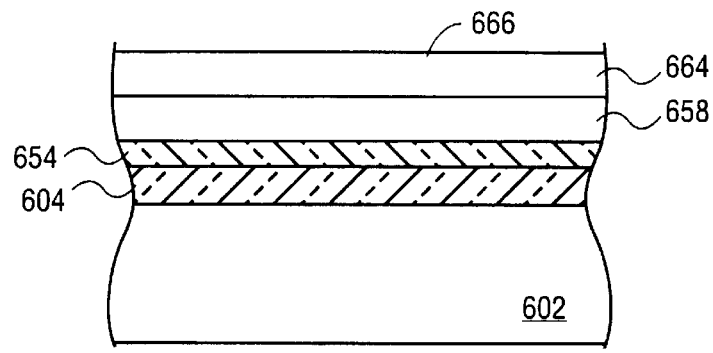
FIG. 6G is an illustration showing the formation of a silicon film on the treated silicon surface of the substrate of FIG. 6F.

Next, if desired, as shown in FIG. 6G a top silicon film 666 can be formed on smoothened surface 664 of transferred donor silicon layer 658 if desired. In an embodiment of he present invention a top silicon film 666 is formed in the same chamber (e.g. chamber 508) in which donor silicon layer 658 was treated. In this way, treated donor silicon layer 658 is not exposed to an oxidizing ambient or to other potential contaminants prior to the formation of top silicon film 666.

In an embodiment of the present invention top silicon film 666 is a single crystalline silicon film (epitaxial silicon) formed by chemical vapor deposition using a silicon source gas, such as trichlorosilane or silane and hydrogen gas. Top silicon film 666 can be formed to any thickness desired and can be formed to any conductivity type and density desired. In an embodiment of the present invention a top silicon film 666 having p-type conductivity type and a dopant density between $10^{15}$–$10^{19}$ atoms/cm$^3$ is formed to a total thickness between 1000 Å–5 $\mu$m. The ability to do a subtractive and additive process described above in a single chamber can be used to provide a silicon film with any surface finish, thickness, and doping density desired. Alternatively, top silicon film 666 can be a silicon alloy such as silicon germanium.

Figure 6H:
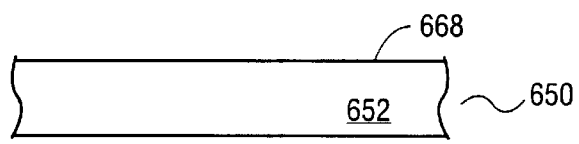
FIG. 6H is an illustration showing the surface treatment of the donor water.
Figure 6I:
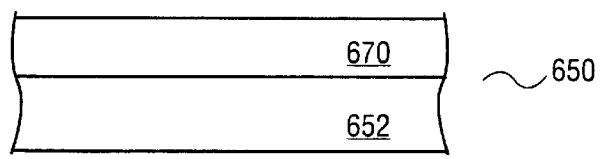
FIG. 6I is an illustration showing the formation of a silicon film on the treated silicon surface of the donor wafer.

Additionally, if desired, donor wafer 650 can be placed into Treatment/Epi chamber 508 to treat the surface of silicon substrate 652 and thereby form a smooth contaminant free surface 668 as shown in FIG. 6H. Additionally, if desired additional silicon 670, such as epitaxial silicon, can be deposited onto surface 668 of donor wafer 650 while donor wafer 650 remains in the treatment/Epi chamber 508 as shown in FIG. 6I. In this way, additional silicon can be continually added to the donor wafer after each transfer process thereby enabling the regeneration of the silicon film on the donor wafer and enabling a much longer lifetime of the donor. Additionally, growing an epitaxial silicon film on the donor wafer allows one to precisely control the dopant type and density of silicon on the donor wafer. Alternatively, a silicon alloy such as silicon germanium can be grown on the surface 668 of donor wafer 650.

Thus, a method and apparatus for treating a silicon or silicon alloy surface has been described. Although the present invention has been described with respect to the treatment of a silicon film of a SOI substrate, and more particularly to a silicon film of a SOI substrate formed by an implant and cleave process, the present invention is not to be limited to these specific embodiments. One skilled in the art will appreciate the ability to use the present invention to treat any silicon or silicon alloy surface where a smooth and contaminant free surface is desired.

Thus, a method and apparatus for treating a silicon surface in order to produce a silicon film with a smooth and contaminant free surface has been described.

What is claimed is:

1. A substrate processing system comprising:
    a chamber;
    a substrate holder, located within the chamber, that holds a substrate having a silicon or silicon alloy surface during substrate processing;
    a gas delivery system for introducing a process gas mix into said chamber;
    a heat source for heating said substrate;
    a controller for controlling said gas delivery system and said heat source;
    a memory coupled to said controller comprising a computer readable medium having a computer readable program and body therein for directing operation of said substrate processing system, said computer readable program comprising:
        instructions for controlling said heat source to heat said substrate to a temperature of between 1000°–3000° C., and instructions for controlling said gas delivery systems to introduce a process gas including HCl while heating said substrate to a temperature of between 1000°–1300° C.

2. A substrate processing apparatus comprising:
    a chamber;
    a substrate holder located within the chamber for holding a substrate;
    a first gas source containing a first gas comprising HCl;
    a gas delivery system for introducing the first gas into the chamber, wherein the gas delivery system comprises a plurality of zones and the flow rate of gas through each zone is independently controllable;
    a heat source for heating the substrate;
    a controller for controlling the gas delivery system and the heat source;
    a memory coupled to the controller, the memory comprising a computer readable medium; and
    a computer readable program resident within the memory, the computer readable program comprising instructions for controlling the heat source to heat the substrate to a temperature of between 1000°–1300° C., and instructions for controlling the gas delivery system to introduce the first gas into the chamber while heating the substrate to a temperature of between 1000°–1300° C.

3. The substrate processing apparatus of claim 2 wherein the computer readable program instructions for controlling the gas delivery system to introduce the first gas into the chamber control the flow rate of the first gas through each zone.

4. The substrate processing apparatus of claim 2 wherein a surface of the substrate comprises silicon or a silicon alloy.

5. The substrate processing apparatus of claim 4 wherein the silicon or silicon alloy is a silicon or silicon alloy film formed on an oxide film formed on a single crystalline silicon substrate.

6. The substrate processing apparatus of claim 2 wherein the computer readable program comprises instructions for controlling the heat source to heat the substrate to a temperature of between 1050°–1200° C.

7. The substrate processing apparatus of claim 2 wherein the first gas further comprises $H_2$.

8. The substrate processing apparatus of claim 7, wherein the first gas has a molecular concentration ratio of HCl to $H_2$ of between 1:100 to 1:1000.

9. A substrate processing apparatus comprising:
    a chamber;
    a substrate holder located within the chamber for holding a substrate;
    a first gas source containing a first gas comprising HCl and $H_2$;
    a second gas source containing a second gas comprising HCl and $H_2$;
    a gas delivery system for introducing the first gas and the second gas into the chamber, wherein the gas delivery system comprises a plurality of zones and the flow rate of gas through each zone is independently controllable;

a heat source for heating the substrate;

a controller for controlling the gas delivery system and the heat source;

a memory coupled to the controller, the memory comprising a computer readable medium; and a computer readable program resident within the memory, the computer readable program comprising instructions for controlling the heat source to heat the substrate to a temperature of between 1000°–1300° C., and instructions for controlling the gas delivery system to introduce the first gas and the second gas into the chamber while heating the substrate to a temperature of between 1000°–1300° C.

10. The substrate processing apparatus of claim 9, wherein the computer readable program comprises instructions for controlling the gas delivery system to sequentially introduce the first gas and the second gas into the chamber.

11. The substrate processing apparatus of claim 9, wherein the second gas has a different molecular concentration ratio of HCl to $H_2$ than the first gas.

12. The substrate processing apparatus of claim 11 wherein the second gas has a lower molecular concentration ratio of HClto $H_2$ than the first gas.

13. A substrate processing apparatus comprising:

a chamber;

a substrate holder located within the chamber for holding a substrate;

a first gas source containing a first gas comprising HCl and $H_2$;

a second gas source containing a second gas comprising HCl and $H_2$ wherein the second gas has a lower molecular concentration ratio of HCl to $H_2$ than said first gas;

a gas delivery system for introducing the first gas and the second gas into the chamber;

a heat source for heating the substrate;

a controller for controlling the gas delivery system and the heat source;

a memory coupled to the controller, the memory comprising a computer readable medium; and a computer readable program resident within the memory, the computer readable program comprising instructions for controlling the heat source to heat the substrate to a temperature of between 1000°–1300° C., and instructions for controlling the gas delivery system to introduce the first gas and the second gas into the chamber while heating the substrate to a temperature of between 1000°–1300° C.

14. The substrate processing apparatus of claim 13 wherein the gas delivery system comprises a plurality of zones and the flow rate of gas through each zone is independently controllable.

15. The substrate processing apparatus of claim 13 wherein the computer readable program comprises instructions for controlling the gas delivery system to sequentially introduce the first gas and the second gas into the chamber.

16. A substrate processing apparatus comprising:

a chamber;

a substrate holder located within the chamber for holding a substrate;

a first gas source containing a first gas comprising HCl;

a gas delivery system for introducing the first gas into the chamber, wherein the gas delivery system comprises a plurality of zones and the flow rate of gas through each zone is independently controllable;

a heat source for heating the substrate;

a controller for controlling the gas delivery system and the heat source;

a memory coupled to the controller, the memory comprising a computer readable medium; and a computer readable program resident within the memory, the computer readable program comprising instructions for controlling the heat source to heat the substrate to a temperature of between 1000°–1300° C., and instructions for controlling the gas delivery system to introduce the first gas into the chamber such that the pressure within the chamber is approximately atmospheric pressure.

17. A substrate processing apparatus comprising:

a chamber;

a substrate holder located within the chamber for holding a substrate;

a first gas source containing a first gas comprising HCl and $H_2$, wherein the first gas has a molecular concentration ratio of HCl to $H_2$ of between 1:100 to 1:1000;

a gas delivery system for introducing the first gas into the chamber;

a heat source for heating the substrate;

a controller for controlling the gas delivery system and the heat source;

a memory coupled to the controller, the memory comprising a computer readable medium; and a computer readable program resident within the memory, the computer readable program comprising instructions for controlling the heat source to heat the substrate to a temperature of between 1000°–1300° C., and instructions for controlling the gas delivery system to introduce the first gas into the chamber while heating the substrate to a temperature of between 1000°–1300° C.

18. A substrate processing apparatus comprising:

a chamber;

a substrate holder located within the chamber for holding a substrate;

a first gas source containing a first gas comprising HCl;

a second gas source containing a second gas comprising silicon;

a gas delivery system for introducing the first gas and the second gas into the chamber, wherein the gas delivery system comprises a plurality of zones and the flow rate of gas through each zone is independently controllable;

a heat source for heating the substrate;

a controller for controlling the gas delivery system and the heat source;

a memory coupled to the controller, the memory comprising a computer readable medium; and a computer readable program resident within the memory, the computer readable program comprising instructions for controlling the heat source to heat the substrate to a temperature of between 1000°–1300° C. while controlling the gas delivery system to introduce the first gas into the chamber, and instructions for controlling the heat source to heat the substrate to a temperature of between 800°–1200° C. while controlling the gas delivery system to introduce the second gas into the chamber.

19. The substrate processing apparatus of claim 18 wherein the second gas comprises silane.

20. The substrate processing apparatus of claim 19 wherein the second gas further comprises $H_2$.

* * * * *